(12) United States Patent
Trivedi

(10) Patent No.: US 7,701,059 B1
(45) Date of Patent: Apr. 20, 2010

(54) LOW RESISTANCE METAL SILICIDE LOCAL INTERCONNECTS AND A METHOD OF MAKING

(75) Inventor: Jigish D. Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1504 days.

(21) Appl. No.: 08/915,658

(22) Filed: Aug. 21, 1997

(51) Int. Cl.
*H01L 23/48* (2006.01)

(52) U.S. Cl. ............... 257/757; 257/750; 257/754; 257/758; 257/763; 257/764; 257/770

(58) Field of Classification Search .......... 257/750, 257/754, 757, 758, 763, 764, 770
See application file for complete search history.

(56) References Cited

U.S. PATENT DOCUMENTS

| | | | |
|---|---|---|---|
| 4,910,578 A * | 3/1990 | Okamoto | 357/71 |
| 5,094,981 A * | 3/1992 | Chung et al. | 437/190 |
| 5,221,853 A | 6/1993 | Joshi et al. | |
| 5,227,333 A * | 7/1993 | Shepard | 437/189 |
| 5,468,662 A | 11/1995 | Havemann | |
| 5,635,765 A | 6/1997 | Larson | |
| 5,646,070 A * | 7/1997 | Chung | 437/200 |

OTHER PUBLICATIONS

Dao, T.; Svejda, F.J.. A dual-port SRAM compiler for 0.8-mm 110K BiCMOS gate arrays. Custom Integrated Circuits Conference, 1991, Proceedings of the IEEE, 1991 pp. 22.4/1-22.4/3.*

* cited by examiner

*Primary Examiner*—Long Pham
(74) *Attorney, Agent, or Firm*—Dinsmore & Shohl LLP

(57) ABSTRACT

A process for forming a local interconnect includes applying a layer of metal over a semiconductor layer. A layer of metal silicide is formed over the layer of metal. The layer of metal silicide is patterned to define the boundaries of the local interconnect. The metal silicide is reacted with the layer of metal to form a composite structure. The composite structure includes the metal silicide, another metal silicide formed as silicon from the metal silicide reacts with the underlying layer of metal and an intermetallic compound of the metal from the layer of metal and metal from the layer of metal silicide. The unreacted layer of metal is removed with the composite structure remaining as the local interconnect.

19 Claims, 7 Drawing Sheets

LOW RESISTANCE METAL SILICIDE LOCAL INTERCONNECTS AND A METHOD OF MAKING

BACKGROUND OF THE INVENTION

The present invention relates in general to a local interconnect, and, more particularly, to a low resistance local interconnect having a refractory metal silicide, and a process of making the same.

In the manufacture of integrated circuits used in the construction of dynamic random access memories (DRAMs), static random access memories (SRAMs), and the like, interconnects are required to provide the necessary electrical paths between field effect transistors and other devices fabricated on the semiconductor substrate and the external circuitry used to pass data to and from these devices. Polycide structures are commonly used to form the gate of a metal oxide semiconductor field effect transistor (MOSFET). Polycide structures are especially attractive for self-aligned gates. A polycide structure is formed by depositing a layer of doped polysilicon over the gate insulation layer. The polysilicon is then etched to define the gate electrode. A refractory metal, such as titanium, is then formed over the remaining polysilicon and silicon substrate. A metal silicide is formed by annealing the polysilicon and the refractory metal with the polysilicon supplying the source of silicon for the silicide. The unreacted refractory metal is etched, with the remaining polysilicon and metal silicide forming the polycide gate.

A local interconnect is typically used to connect the polycide gate to certain active semiconductor areas, such as the drain or source of another MOSFET. A local interconnect may also be used to connect active semiconductor areas to other active semiconductor areas which are separated by an insulating region, such as a field oxide region. Titanium silicide ($TiSi_2$) is commonly used as a local interconnect for connecting desired polycide gates and active semiconductor areas. $TiSi_2$ may be formed through physical vapor deposition (PVD) or chemical vapor deposition (CVD). PVD entails sputtering titanium followed by a layer of silicon. The titanium and silicon are reacted to form $TiSi_2$. Silicon from the underlying areas also reacts with the titanium to form $TiSi_2$. CVD typically entails reacting titanium tetrachloride ($TiCl_4$) and silane ($SiH_4$) in the gas phase to form $TiSi_2$. Silicon from the underlying areas is also consumed in the CVD reaction to form $TiSi_2$.

While $TiSi_2$ is a relatively low resistive conductor, the titanium is susceptible to oxidation during and after its formation. The resultant titanium dioxide ($TiO_2$) increases the sheet resistance of the interconnect thereby increasing power dissipation and reducing the speed of the device. As used herein, sheet resistance is an electrical quantity measured on a thin layer and has the units of ohms/square. Further, a layer of $TiO_2$ makes it difficult to form good electrical contacts on the $TiSi_2$ interconnect and poses adhesion problems when subsequent layers are deposited on top of the interconnect line. Further, $TiSi_2$ is susceptible to damage during subsequent contact formation as the typical contact etch also consumes $TiSi_2$. Typically, the size of the interconnect must be increased in order to compensate for damage caused by the contact etch.

Accordingly, there is a need for a local interconnect having a lower resistance and one in which the effects of oxidation are reduced. Preferably, the local interconnect is smaller in width and thickness. There is also a need for a method of forming such a local interconnect. Preferably, such a method would be inexpensive, easy to implement and would not entail excess processing steps.

SUMMARY OF THE INVENTION

The present invention meets these needs by providing a local interconnect formed by a process in which a layer of metal silicide serves both as a hard mask and source of silicon for an underlying layer of metal. The metal silicide is patterned to form the boundaries of the local interconnect and then reacted with the underlying layer of metal. Silicon from the metal silicide combines with the underlying metal to form another metal silicide. An intermetallic compound comprised of metal from the underlying metal layer and metal from the metal silicide is also formed. Unreacted metal from the underlying metal layer is removed to form the local interconnect. The metal silicide also serves as a contact etch stop during subsequent contact formation thereby allowing for a smaller local interconnect.

According to a first aspect of the present invention, a process of forming a local interconnect comprises providing at least one semiconductor layer. A layer of metal is formed over the at least one semiconductor layer. A contact etch stop is formed over the layer of metal. The layer of metal is reacted with the contact etch stop and then the unreacted metal is removed from the layer of metal to form the local interconnect. The contact etch stop may comprise a metal silicide. The process may further comprise the step of patterning the contact etch stop to form the boundaries of the local interconnect. The step of patterning the contact etch stop to form the boundaries of the local interconnect may be performed prior to the step of reacting the layer of metal with the contact etch stop.

According to another aspect of the present invention, a process of forming a local interconnect comprises providing at least one semiconductor layer. A layer of metal is formed over the at least one semiconductor layer. A layer of metal silicide is formed over the layer of metal. The layer of metal silicide is reacted with the layer of metal, and then unreacted metal remaining from the layer of metal is removed to form the local interconnect. The layer of metal may comprise a refractory metal selected from the group consisting of chromium, cobalt, molybdenum, nickel, niobium, palladium, platinum, tantalum, titanium, tungsten, and vanadium. Preferably, the refractory metal comprises titanium. The layer of metal may have a thickness in the range of about 200 Angstroms to about 600 Angstroms, and preferably, approximately 300 Angstroms. The layer of metal silicide may comprise tungsten silicide. The layer of metal silicide may have a thickness in the range of about 500 Angstroms to about 1200 Angstroms, and preferably, in the range of about 600 Angstroms to about 700 Angstroms. The step of reacting the layer of metal silicide with the layer of metal may comprise annealing the layer of metal silicide and the layer of metal at a temperature ranging from about 600° C. to about 700° C.

According to yet another aspect of the present invention, a process of forming a local interconnect comprises providing at least one semiconductor layer. A layer of metal is formed over the at least one semiconductor layer by chemical vapor deposition (CVD). A layer of metal silicide is formed over the layer of metal by CVD. The layer of metal silicide is then patterned. The metal silicide is reacted with the layer of metal and then unreacted metal remaining from the layer of metal is removed to form the local interconnect. The step of forming a layer of metal over the at least one semiconductor layer by CVD and the step of forming a layer of metal silicide over the layer of metal by CVD are preferably carried out in the same vacuum environment.

According to a further aspect of the present invention, a process of forming a local interconnect comprises providing at least one semiconductor layer. A layer of metal is formed over the at least one semiconductor layer. A layer of first metal silicide is formed over the layer of metal. The layer of first metal silicide and the layer of metal are annealed to form a composite structure. Remaining metal from the layer of metal is removed to form the local interconnect. The composite structure may comprise the first metal silicide, a second metal silicide and an intermetallic compound comprising metal from the layer of metal and metal from the first metal silicide. The layer of metal may comprise titanium and the first metal silicide may comprise tungsten silicide, such that the composite structure comprises tungsten silicide, titanium silicide, and titanium tungsten intermetallic compound. The process may further comprise the step of patterning the layer of first metal silicide to form a boundary of the local interconnect. The step of patterning the layer of first metal silicide to form a boundary of the local interconnect is preferably performed prior to the step of annealing the layer of first metal silicide and the layer of metal to form a composite structure.

According to a still further aspect of the present invention, a process of forming a local interconnect comprises providing at least one semiconductor layer. A layer of refractory metal is formed over the at least one semiconductor layer. A layer of first metal silicide is formed over the layer of refractory metal. The layer of first metal silicide is patterned to define a boundary of the local interconnect. The patterned first metal silicide and the layer of refractory metal are annealed to form a composite structure. Refractory metal remaining from the layer of refractory metal is removed to form the local interconnect. The step of patterning the layer of first metal silicide to define a boundary of the local interconnect may comprise the step of selectively etching the layer of first metal silicide. The step of selectively etching the layer of first metal silicide may comprise the step of dry etching the layer of first metal silicide. The step of annealing the patterned first metal silicide and the layer of refractory metal to form a composite structure is preferably carried out in an atmosphere of reactive nitrogen such that at least refractory metal remaining from the layer of refractory metal is nitrified.

According to another aspect of the present invention, a process of forming a local interconnect comprises providing at least one semiconductor layer. A layer of titanium having a thickness ranging from about 200 Angstroms to about 600 Angstroms is formed over the at least one semiconductor layer. A mask layer of tungsten silicide having a thickness ranging from about 500 Angstroms to about 1200 Angstroms is formed over the layer of titanium. The mask layer is selectively etched to define a boundary of the local interconnect. The mask layer and the layer of titanium are annealed in an atmosphere of reactive nitrogen thereby forming a composite structure of titanium silicide, tungsten silicide and a titanium tungsten intermetallic compound where the mask layer contacts the layer of titanium. The layer of titanium not covered by the mask layer is nitrified to form a layer of titanium nitride. The layer of titanium nitride and underlying titanium is then removed to form the local interconnect.

According to yet another aspect of the present invention, a process of forming a semiconductor device comprises providing a substrate assembly having at least one semiconductor layer. Source and drain regions of a field effect transistor are formed in the at least one semiconductor layer. A gate oxide is formed over the at least one semiconductor layer. A gate contact is formed over the gate oxide. A layer of refractory metal is formed over the at least one semiconductor layer. A layer of first metal silicide is formed over the layer of metal. The layer of first metal silicide is patterned to define a boundary of a local interconnect. The layer of refractory metal and the layer of first metal silicide are annealed to form a composite structure. Remaining refractory metal from the layer of refractory metal is removed to form the local interconnect. The local interconnect connects at least one of the source, drain, and gate to another active area within the substrate assembly.

According to a further aspect of the present invention, a process of forming a memory array having a plurality of memory cells arranged in rows and columns with each of the plurality of memory cells comprising at least one field effect transistor comprises providing at least one semiconductor layer. Sources, drains and gates for each of the field effect transistors are formed over the at least one semiconductor layer. A layer of refractory metal is formed over the at least one semiconductor layer. A layer of first metal silicide if formed over the layer of refractory metal. The layer of first metal silicide is patterned to define a boundary of at least one local interconnect. The layer of refractory metal and the layer of first metal silicide are annealed to form a composite structure. Remaining metal from the layer of refractory metal is removed to form the at least one local interconnect. The at least one local interconnect connects at least one of the source, drain and gate of one of the field effect transistors with another active area of the memory array.

According to a yet still further aspect of the present invention, a process of fabricating a wafer comprises providing a wafer having a substrate assembly. The substrate assembly has at least one semiconductor layer. A repeating series of sources, drains and gates for at least one field effect transistor on each of a plurality of individual die on the wafer are formed over the at least one semiconductor layer. A layer of refractory metal is formed over the at least one semiconductor layer. A layer of first metal silicide is formed over the layer of refractory metal. The layer of first metal silicide is patterned to define a boundary of at least one local interconnect in each of the individual die. The layer of refractory metal and the layer of first metal silicide are annealed to form a composite structure and refractory metal remaining from the layer of refractory metal is removed to form the at least one local interconnect in each of the individual die. The at least one local interconnect in each of the individual die connect at least one of the source, drain and gate of one of the field effect transistors with another active area in each of the individual die.

According to a further aspect of the present invention, a local interconnect comprises a composite structure. The composite structure comprises a first metal silicide, a second metal silicide and an intermetallic compound comprising metal from the first metal silicide and metal from the second metal silicide. The first metal silicide and the second metal silicide preferably each comprise at least one refractory metal. The at least one refractory metal for the first metal silicide and the second metal silicide are selected from the group consisting of chromium, cobalt, molybdenum, nickel, niobium, palladium, platinum, tantalum, titanium, tungsten, and vanadium. Preferably, the first metal silicide comprises titanium silicide and the second metal silicide comprises tungsten silicide.

According to a still further aspect of the present invention, a local interconnect for connecting a first active semiconductor region to a second active semiconductor region on a substrate assembly with the first and second active semiconductor regions being separated by an insulating region comprises a composite structure. The composite structure comprises a first refractory metal silicide, a second refractory metal silicide and an intermetallic compound comprising refractory metal from the first refractory metal silicide and refractory metal from the second refractory metal silicide. The refractory metal from the first refractory metal silicide is different from the refractory metal from the second refractor metal silicide. The composite structure preferably has a thickness in the range of about 700 Angstroms to about 1800 Angstroms.

According to another aspect of the present invention, a semiconductor device comprises a substrate assembly having at least one semiconductor layer. At least one field effect transistor is formed in the at least one semiconductor layer with the least one field effect transistor having a source, a drain and a gate. The semiconductor device further comprises a local interconnect for connecting at least one of the source, the drain and the gate to another active area within the substrate assembly. The local interconnect comprises a composite structure comprising a first refractory metal silicide, a second refractory metal silicide and an intermetallic compound comprising refractory metal from the first refractory metal silicide and refractory metal from the second refractory metal silicide.

According to a yet still further aspect of the present invention, a memory array comprises a plurality of memory cells arranged in rows and columns and formed on a substrate assembly having at least one semiconductor layer. Each of the plurality of memory cells comprises at least one field effect transistor and at least one local interconnect for connecting at least one of a source, a drain and a gate of the at least one field effect transistor in one of the plurality of memory cells to one of an active area within the one memory cell or to one of a source, a drain and a gate of the at least one field effect transistor in another one of the plurality of memory cells. The local interconnect comprises a composite structure comprising a first refractory metal silicide, a second refractory metal silicide and an intermetallic compound comprising refractory metal from the first refractory metal silicide and refractory metal from the second refractory metal silicide. The memory array may further comprise a plurality of local interconnects for connecting additional active areas within each of the plurality of memory cells. The memory array may also further comprise a plurality of local interconnects for connecting together active areas from different memory cells.

Accordingly, it is an object of the present invention to provide a low resistance local interconnect by a process in which a layer of metal silicide serves both as a mask and contact etch stop. Another aspect of the present invention is to provide a local interconnect which is smaller in width and thickness. Yet another object of the present invention is to provide a process of forming a local interconnect in which the negative effects of oxidation are reduced. It is a further object of the present invention to provide a process of forming a local interconnect which is inexpensive, easy to implement, and does not entail excess processing steps.

Other features and advantages of the invention will be apparent from the following description, the accompanying drawings and the appended claims.

DETAILED DESCRIPTION OF THE PREFERRED EMBODIMENTS

Figure 1:
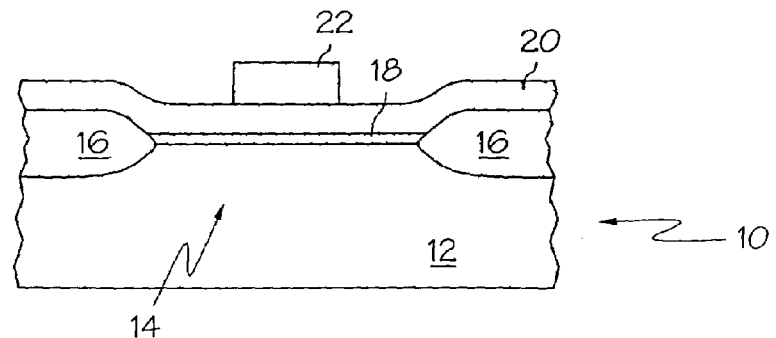
FIGS. 1-2 are enlarged, sectioned side views depicting the formation of a MOSFET for interconnection according to an aspect of the present invention.

Referring now to FIG. 1, a substrate assembly 10 is shown. The substrate assembly 10 comprises a semiconductor layer 12, which is silicon in the illustrated embodiment, and may also include additional layers or structures which define active or operable portions of semiconductor devices (not shown). For example, the semiconductor layer 12 of the substrate assembly 10 may be formed on insulating material, sapphire or another base material. The semiconductor layer 12 is doped with impurities to form a semiconductor of a first/p-type conductivity, or a second/n-type conductivity.

A number of different semiconductor devices may be formed on the semiconductor layer 12. In the illustrated embodiment, a metal oxide semiconductor field effect transistor (MOSFET) 14 having a self-aligned gate (G) is formed. It will be appreciated by those skilled in the art that the term MOSFET is a generic term for any field effect transistor in which a conductive material is formed over the gate insulating material of a field effect transistor. The MOSFET 14 having the self-aligned gate (G) may be formed in accordance with the process described in abandoned application, U.S. Ser. No. 08/858,772 A METHOD OF FORMING A FIELD EFFECT TRANSISTOR HAVING A SELF-ALIGNED GATE, filed May 20, 1997, by Donahoe et al., herein incorporated by reference. Another method of forming the MOSFET 14 comprises the following steps. The MOSFET 14 is isolated by a pair of field oxide regions 16. A gate insulation layer 18 is formed over the semiconductor layer 12 to a thickness of about 50 Angstroms to about 500 Angstroms depending on the device type and function. The field oxide regions 16 and the gate insulation layer 18 are comprised of silicon dioxide in the illustrated embodiment. A layer of polysilicon 20 is formed over the gate insulation layer 18 to a thickness of approximately 4000 Angstroms. The layer of polysilicon 20 may be doped with impurities, such as phosphorous or boron, either in situ or after the layer 20 is formed, to increase its conductivity. A photoresist pattern 22 is then used to define the gate (G). The exposed portions of polysilicon 20 are then removed using conventional etching techniques along with the photoresist pattern 22.

Figure 2:
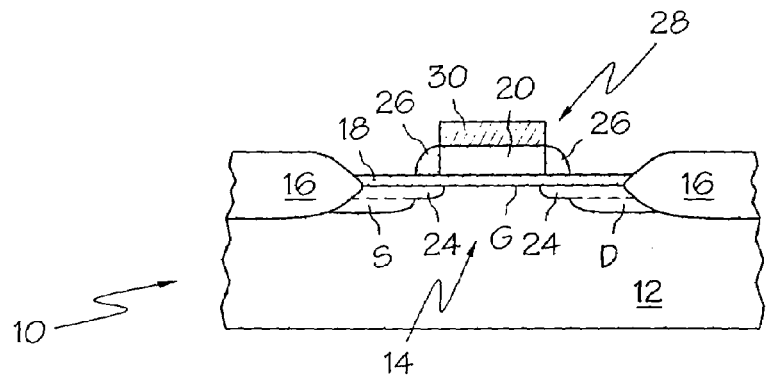

As shown in FIG. 2, an implant is added to the semiconductor layer 12 in order to form a lightly doped drain. In the illustrated embodiment, an n-type lightly doped section 24 is formed in the semiconductor layer 12 and is aligned with the lateral edges of the polysilicon layer 20. A proper dopant, such as phosphorus, is ion implanted into the semiconductor layer 12 to form the n-type lightly doped section 24. It will be appreciated by those skilled in the art that other methods may be used to deposit the dopant into the semiconductor layer 12. A layer of silicon dioxide is formed over the semiconductor layer 12 and anisotropically etched to form spacers 26 on the sides of the polysilicon 20. Another proper dopant is ion implanted into the semiconductor layer 14 to form an n+ source (S) and an n+ drain (D) with the spacers 26 acting as ion masks. It will be appreciated by those skilled in the art that the source (S) and the drain (D) terminals of a MOS transistor are typically identical with the drain/source label being applied for descriptive purposes once a voltage is applied to the transistor. For example, for n-type MOSFETs, the drain designation is applied to the terminal having the higher voltage potential with the source designation being applied to the other terminal. An anneal is then performed to repair the crystal damage caused by the ion implants and to electrically activate the dopants. It will be appreciated by those skilled in the art that the source (S) and the drain (D) may be formed by diffusion or epitaxy. The exposed portion of the gate insulation layer 18 is then removed thereby exposing the source (S) and drain (D) of the MOSFET 14. The source (S), drain (D) and gate (G) are active semiconductor areas for producing desired electronic functions. It will be appreciated by those skilled in the art that other active semiconductor areas, such as diodes, bipolar transistors, resistors, capacitors, and the like, may be formed on the semiconductor layer 12.

The resistance of the gate (G) is further reduced by forming a polycide gate contact 28. As described above, a refractory metal, such as titanium, is formed over the polysilicon 20. Titanium silicide 30 is then formed by reacting the titanium with the polysilicon 20 by annealing the same at an appropriate temperature for an appropriate period of time. The polycide gate contact 28 may then be interconnected with other active semiconductor areas as desired.

FIGS. 3-6 show a local interconnect fabrication process according to an aspect of the present invention. In the illustrated embodiment, the drain (D) of the MOSFET 14 is connected to the source (S') of another MOSFET 14' formed adjacent to the MOSFET 14. The MOSFET 14' is formed using the same process described above with respect to the MOSFET 14. It should be apparent that other active semiconductor areas may be interconnected, such as the polycide gate contacts 28 of a number of different MOSFETs, or a gate (G) of one MOSFET to the drain (D) or the source (S) of another MOSFET. Further, other active semiconductor areas, such as a pair of diodes, may be interconnected with the local interconnect as described herein.

Figure 3:
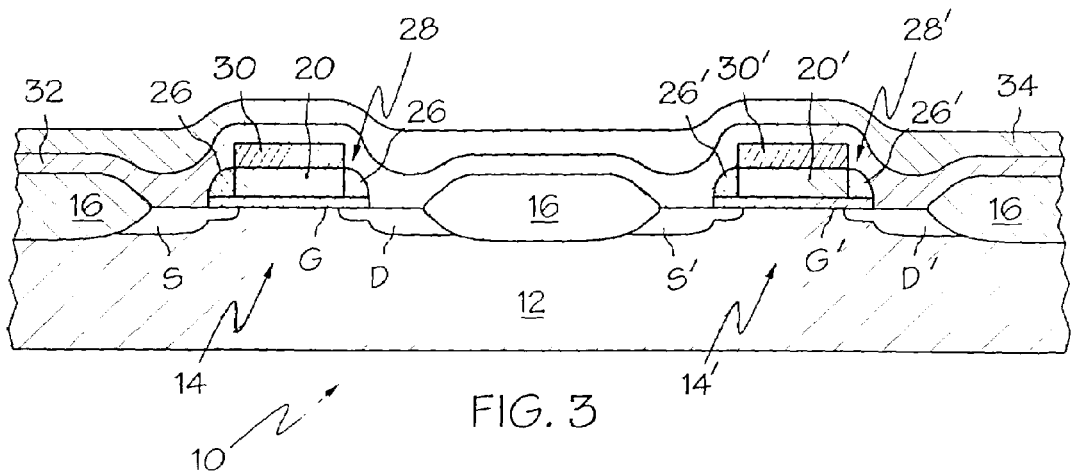
FIGS. 3-7 are enlarged, sectional side views depicting the formation of a local interconnect according to an aspect of the present invention.

Referring specifically to FIG. 3, a layer of metal 32, such as titanium, is formed over the semiconductor layer 12 to a thickness ranging from about 200 Angstroms to about 600 Angstroms, and preferably about 300 Angstroms. The layer of Ti 32 may be formed by sputtering Ti using physical vapor deposition (PVD) at a temperature ranging from about 300° C. to about 500° C. for a predetermined period of time. The layer of Ti 32 may also be formed using chemical vapor deposition (CVD) at a temperature ranging from about 600° C. to about 700° C., and typically from about 625° C. to about 650° C., for a predetermined period of time. It should be apparent that the predetermined periods of time are dependent in part on the temperature selected for each of the above deposition methods. It will be appreciated by those skilled in the art that other deposition methods may be used to form the layer of Ti 32.

A layer of first metal silicide 34, such as tungsten silicide (WSi$_x$), is formed over the layer of Ti 32 to a thickness ranging from about 500 Angstroms to about 1200 Angstroms, and preferably from about 600 Angstroms to about 700 Angstroms. In the illustrated embodiment, the layer of WSi$_x$ 34 is formed using CVD by reacting tungsten hexafluoride (WF$_6$) with silane (SiH$_4$) in the gas phase at a temperature ranging from about 350° C. to about 450° C. It will be appreciated by those skilled in the art that other deposition methods may be used to form the layer of WSi$_x$ 34. However, formation of the layer of Ti 32 and the layer of WSi$_x$ 34 using CVD allows the layers to be formed in the same deposition chamber and vacuum environment, thereby simplifying the manufacturing process as the wafer does not have to be transferred between different chambers. Further, the negative effects of oxidation are reduced as the wafer is maintained in the same vacuum environment during formation of the layer of Ti 32 and the layer of WSi$_x$ 34.

Figure 4:
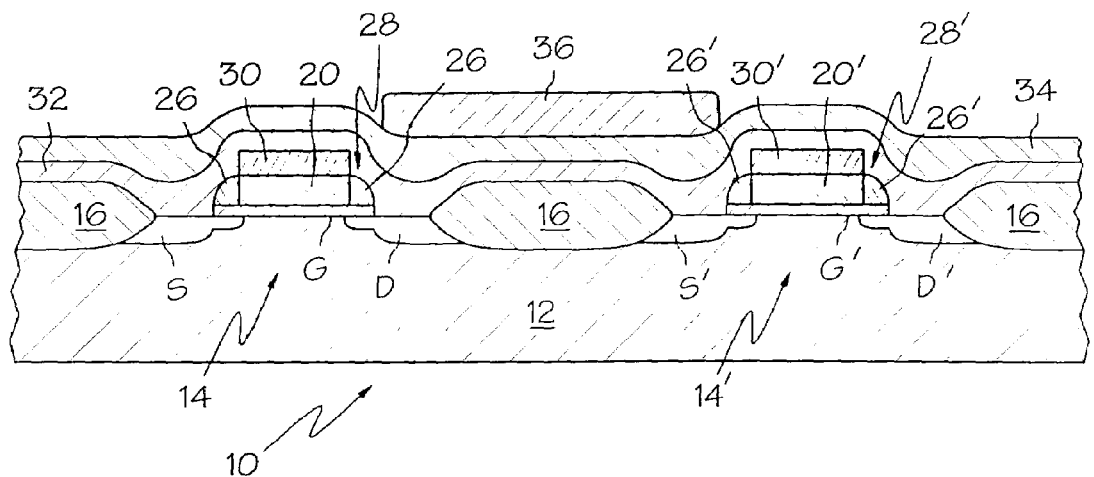
Figure 5:
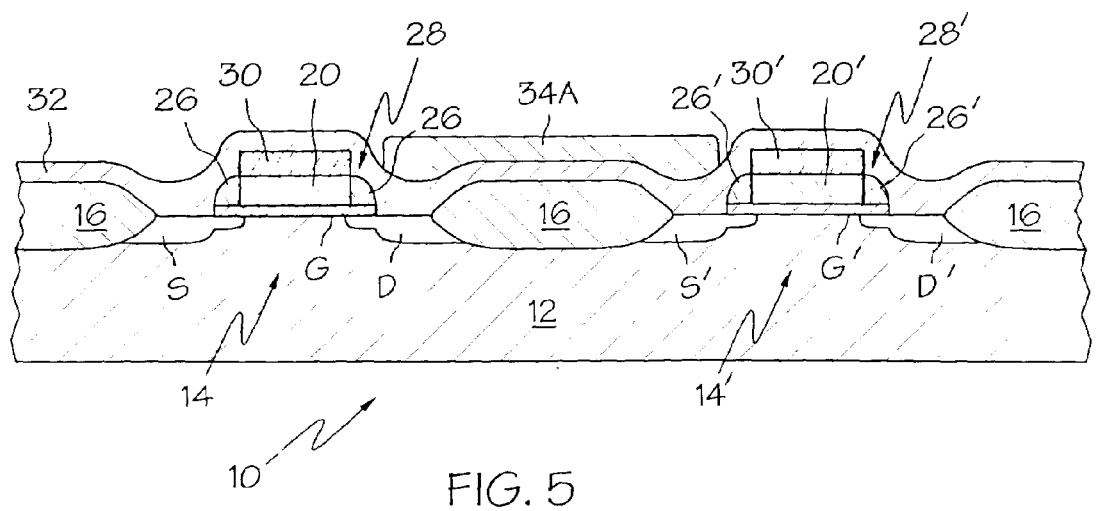

The boundary of the local interconnect is then defined through photolithography. A layer of photoresist 36 is formed over the layer of WSi$_x$ 34 and patterned using conventional methods as shown in FIG. 4. Referring now to FIG. 5, the exposed portions of the WSi$_x$ 34 are removed using a selective dry etch, thereby forming a patterned WSi$_x$ structure 34A. The selective etch removes the WSi$_x$ but does not affect the underlying layer of Ti 32. The remaining photoresist 36 is removed using conventional methods with the remaining patterned WSi$_x$ structure 34A defining the boundaries of the local interconnect. The WSi$_x$ therefore serves as a hard mask for the local interconnect as the WSi$_x$ may be selectively etched without removing any of the underlying Ti.

Figure 6:
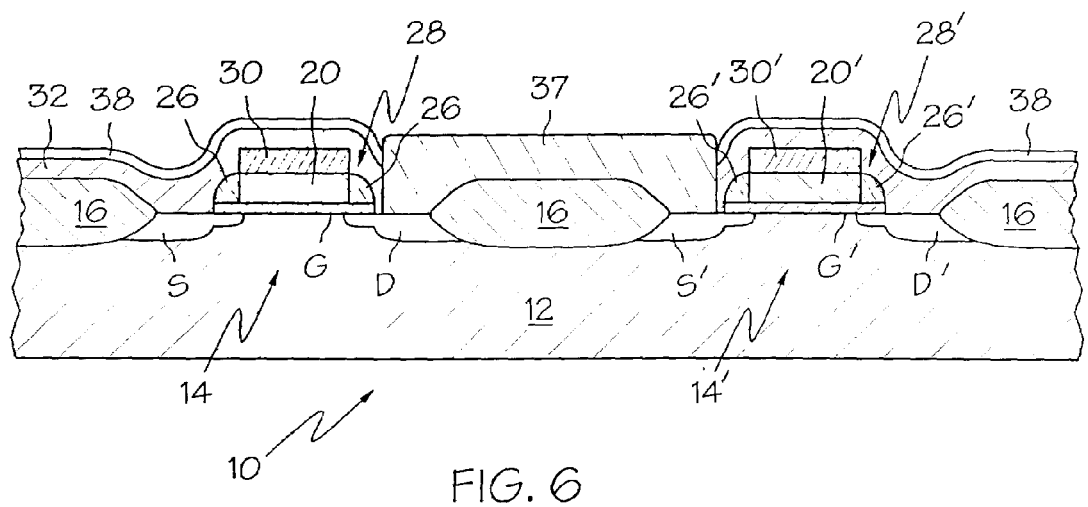

The patterned WSi$_x$ structure 34A is reacted with the layer of Ti 32 by annealing the same at a temperature ranging from about 600° C. to about 700° C. in an atmosphere of reactive nitrogen, such as N$_2$ gas. The anneal may comprise a rapid thermal anneal (RTA) or a rapid thermal process (RTP). The anneal is performed in an oxygen free environment to prevent the formation of any undesired oxide layer. As shown in FIG. 6, a composite structure 37 is formed. The composite structure 37 comprises a second metal silicide as the underlying layer of Ti 32 in contact with the patterned WSi$_x$ structure 34A is converted to TiSi$_2$. The patterned WSi$_x$ structure 34A serves as the source of silicon for converting the underlying layer of Ti 32 to TiSi$_2$. The composite structure also includes an intermetallic compound or alloy of Ti W as well as the remaining WSi$_x$. The intermetallic compound of Ti W reduces the resistance of the local interconnect while also increasing its adhesion characteristics. The composite structure 37 has a thickness ranging from about 700 Angstroms to about 1800 Angstroms. A thin layer of titanium nitride (TiN) 38 is also formed in the uncovered portions of Ti as the reactive nitrogen reacts with the exposed Ti. Some of the Ti also reacts with the underlying silicon as the active semiconductor areas are silicided. As most active semiconductor areas are typically silicided to increase conductivity, the present invention allows for the formation of the local interconnect while siliciding the active semiconductor areas in a single set of processing steps.

Figure 7:
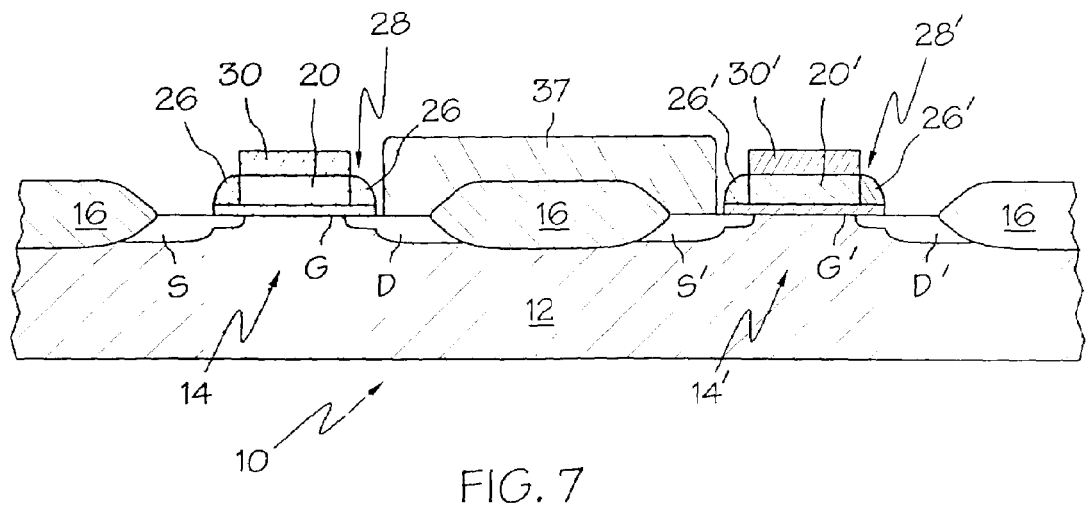

As shown in FIG. 7, the unreacted Ti and the layer of TiN 38 are selectively removed with the composite structure 37 forming the local interconnect. Therefore, the composite structure 37 and the local interconnect, along with the reference number, may be used interchangeably. In the illustrated embodiment, a selective wet etch is used to remove the TiN and the Ti without affecting the composite structure 37. Additional local interconnects may be formed using the above process so that the desired electronic configuration is achieved. Further, additional processing steps, such as metalization layers, insulating layers, passivating layers, and the like, may be added. During subsequent contact formation, the WSi$_x$ acts as a contact etch stop. Once all of the desired connections and layers are formed, contacts must be added to connect the electronic device to external pins. The prior art TiSi$_2$ local interconnect was damaged during the contact etch as TiSi$_2$ is susceptible to the etch. However, the contact etch stops at WSi$_x$, thereby protecting the underlying TiSi$_2$ as the WSi$_x$ does not react with the contact etch. Accordingly, the size of the local interconnect may be reduced as no damage is caused to the TiSi$_2$ during the contact etch.

While in the illustrated embodiment, titanium is the metal selected to form the layer of metal 32, it will be appreciated by those skilled in the art that other metals, particularly, refractory metals, such as chromium, cobalt, molybdenum, nickel, niobium, palladium, platinum, tantalum, tungsten, and vanadium, may be used to form the layer of metal 32. Further, while tungsten silicide was used to form the layer of first metal silicide 34, it will be appreciated by those skilled in the art that other metals, particularly, refractory metals, such as chromium, cobalt, molybdenum, nickel, niobium, palladium, platinum, tantalum, titanium and vanadium, may be used as the metal to form the first metal silicide 34.

Figure 8:
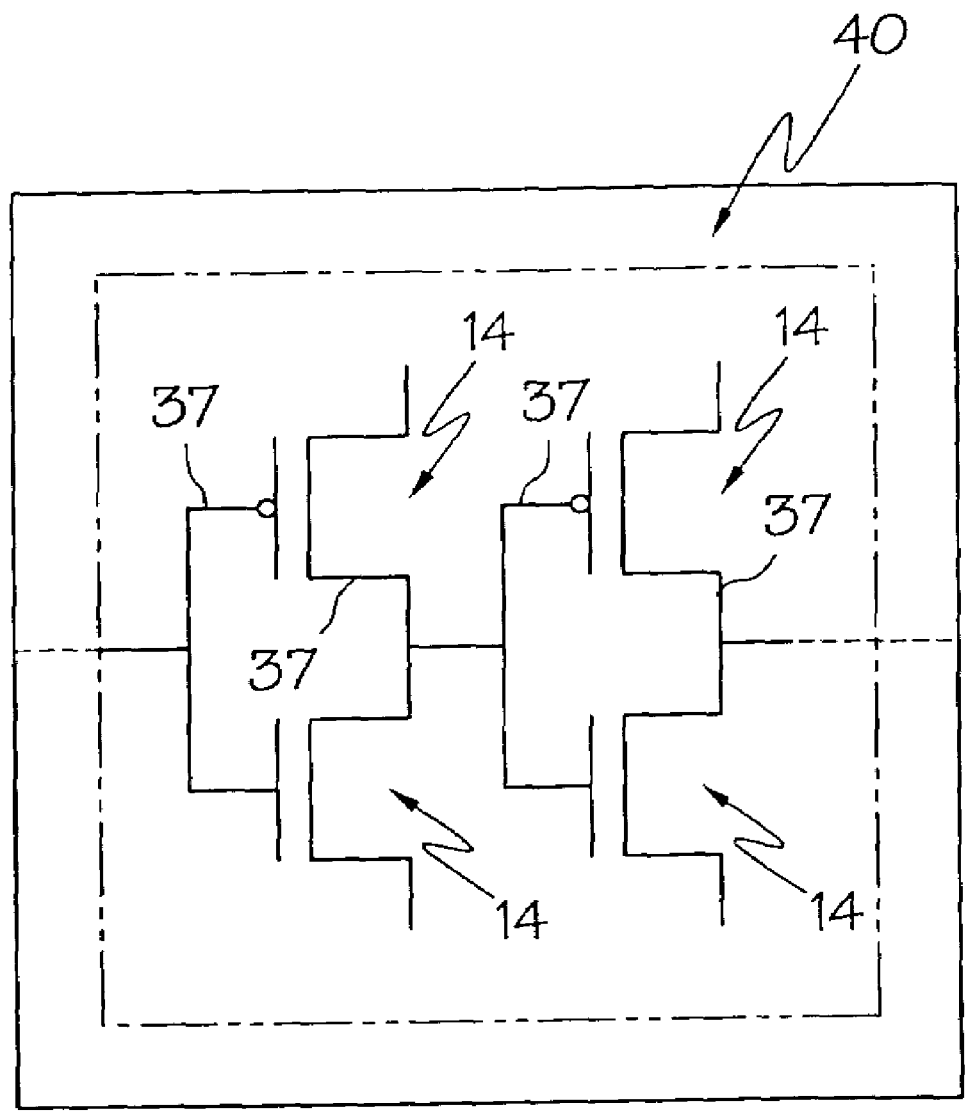
FIG. 8 is a schematic diagram of an integrated circuit with a pair of CMOS inverters interconnected by the local interconnect of FIG. 7.
Figure 9:
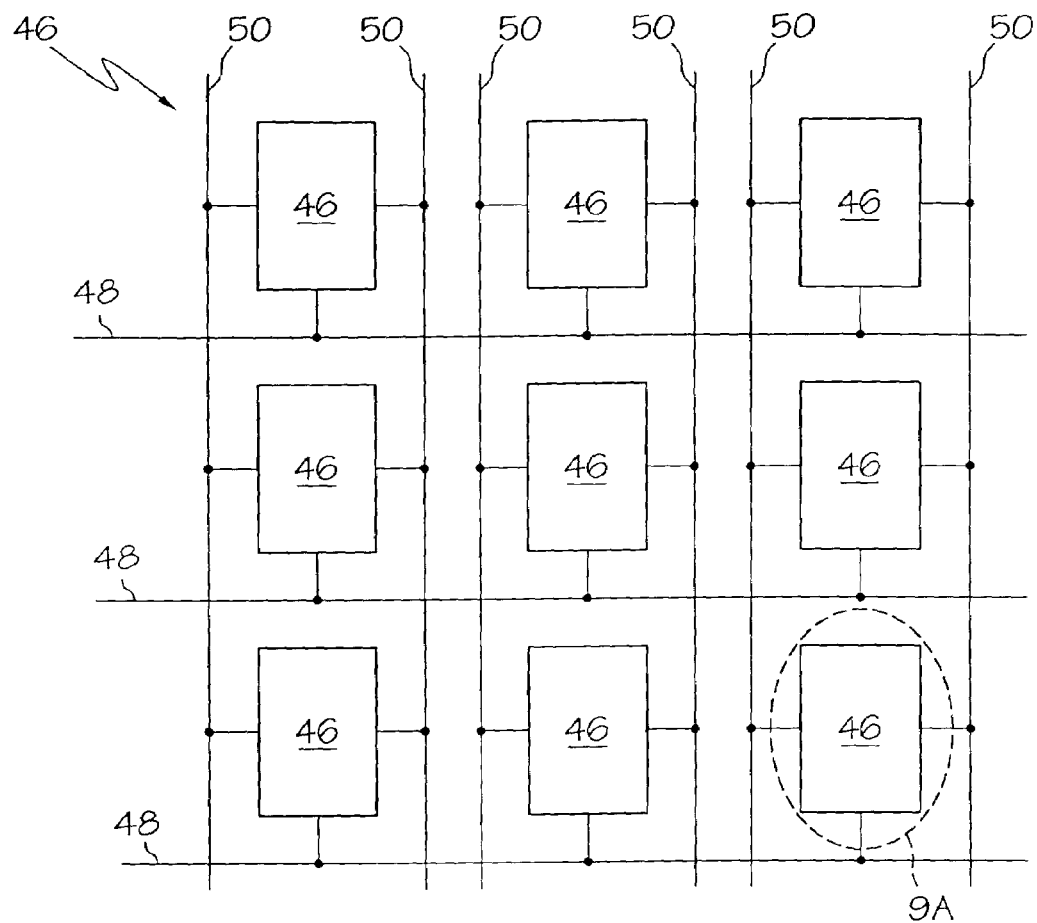
FIG. 9 is a schematic diagram of an SRAM array having a plurality of memory cells arranged in rows and columns.
Figure 9A:
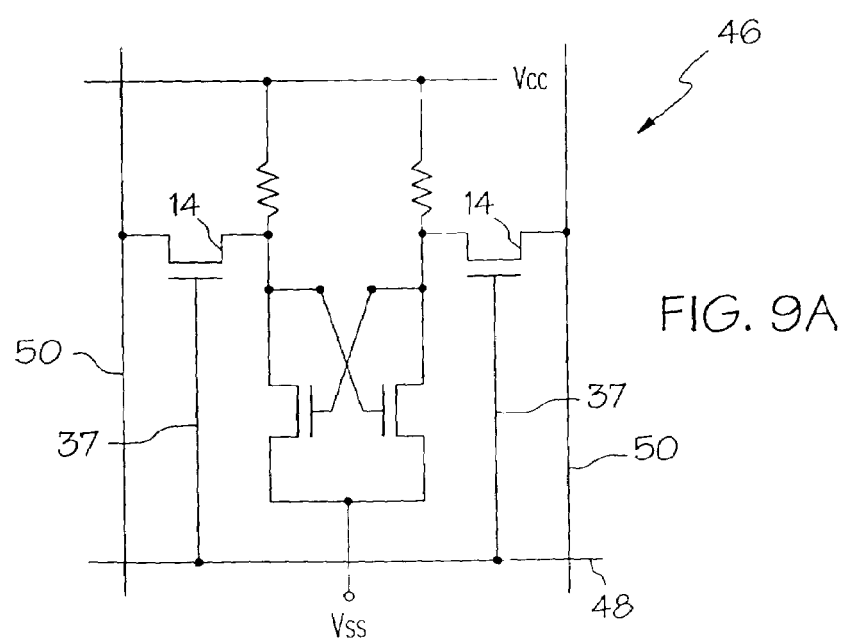
FIG. 9A is a schematic diagram of a representative memory cell of the SRAM array of FIG. 9 with the local interconnect of FIG. 7.
Figure 10:
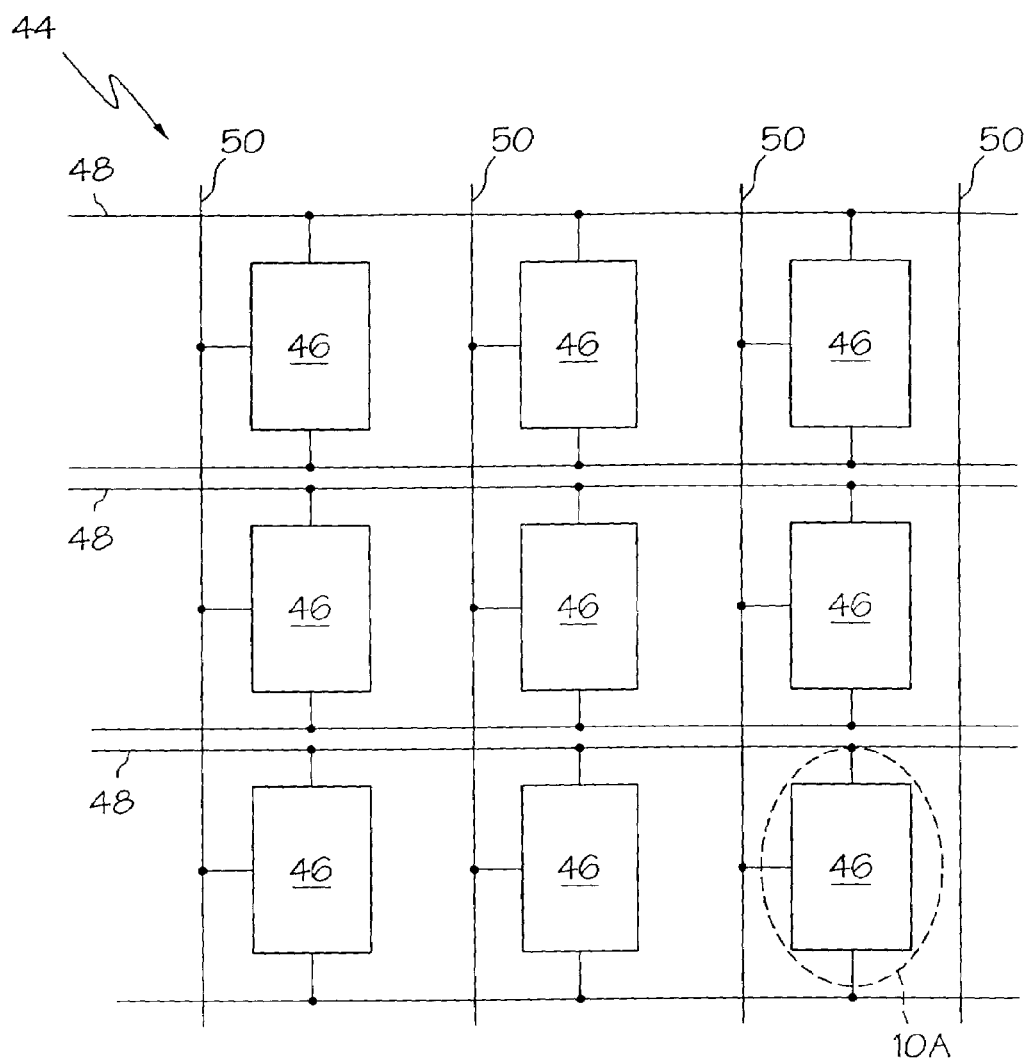
FIG. 10 is a schematic diagram of a DRAM array having a plurality of memory cells arranged in rows and columns.
Figure 10A:
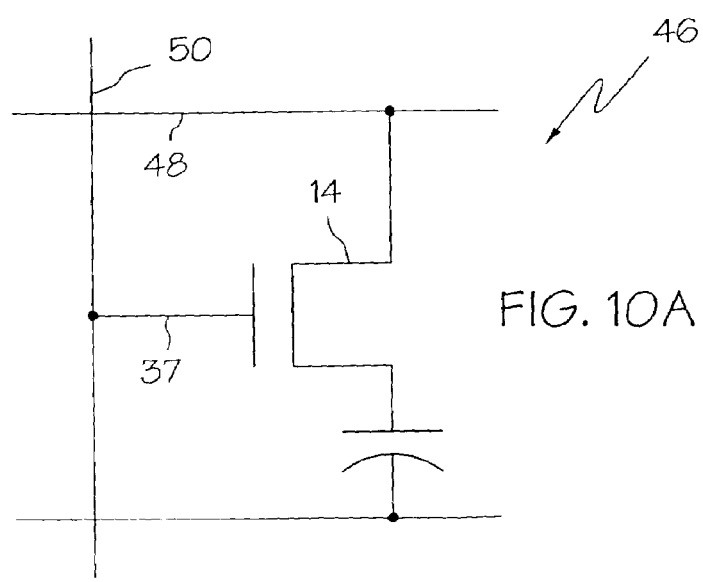
FIG. 10A is a schematic diagram of a representative memory cell of the DRAM array of FIG. 10 with the local interconnect of FIG. 7.
Figure 11:
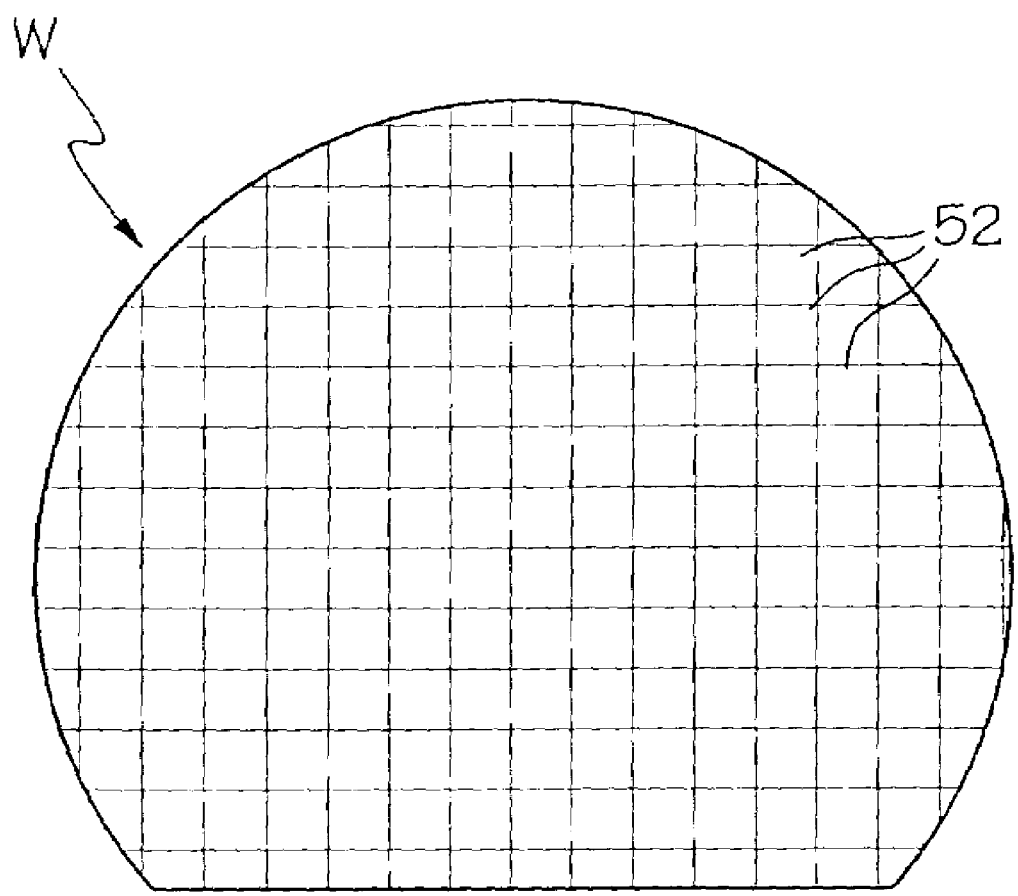
FIG. 11 is a top view of a wafer having the local interconnect of FIG. 7.

As shown schematically in FIG. 8, one or more of the local interconnects 37 may be used to connect various structures in an integrated circuit 40, such as the gates of two or more transistors 14, and respective sources to respective drains. One or more of the local interconnects 37 may also be used in a typical static random access memory (SRAM) array 42 or in a typical dynamic random access memory (DRAM) array 44, as shown in FIGS. 9 and 10. The SRAM array 42 and the DRAM array 44 comprise a plurality of memory cells 46 arranged in rows and columns. Each of the memory cells 46 also comprise at least one transistor 14. By way of example and as shown in FIG. 9A, each of the memory cells 46 of the SRAM array 42 comprise a pair of access transistors 14, the gates of which are coupled to a respective row line 48 via the local interconnect 37 of FIG. 7. Similarly, as shown in FIG. 10A, each of the memory cells 46 of the DRAM array 44 comprise a switch transistor 14, the gate of which is coupled to a respective word line 50 via the local interconnect 37 of FIG. 7. It should be apparent that the configuration of the local interconnects 37 is dependent, in part, on the desired interconnection of the gates of the transistors 14 as well as the interconnection of the sources and drains of the transistors 14. It should also be apparent that other devices within the integrated circuit 40, the SRAM array 42 and the DRAM array 44, such as external contacts, other FET transistors, bipolar transistors, resistors, capacitors, and the like, may be interconnected via the local interconnect 37. It should therefore be apparent that the local interconnect 37 is not limited to connections including the active areas of MOSFETs but may include connections to the other components listed above without connecting to the active areas of a MOSFET. The local interconnect 37 may also be used in the fabrication of a wafer W as shown in FIG. 10. The wafer W includes a plurality of individual dies 52. Wafer masks (not shown) are used to apply a desired circuit structure on each of the individual dies 52. The desired circuit structure may comprise any of the above described structures, i.e. the integrated circuit 40, the SRAM array 42 or the DRAM array 44, with the appropriate local interconnects 37. The wafer W is processed using standard wafer fabrication techniques.

Having described the invention in detail and by reference to preferred embodiments thereof, it will be apparent that modifications and variations are possible without departing from the scope of the invention defined in the appended claims.

What is claimed is:

1. A local interconnect comprising:
a composite structure comprising a first metal silicide, a second metal silicide and an intermetallic compound reducing the resistance of said local interconnect, wherein said intermetallic compound comprises metal from said first metal silicide and metal from said second metal silicide, wherein said intermetallic compound contains no non-metallic materials.

2. The local interconnect of claim 1, wherein said first metal silicide and said second metal silicide, each comprise at least one refractory metal.

3. The local interconnect of claim 2, wherein said at least one refractory metal for said first metal silicide and said second metal silicide is selected from the group consisting of chromium, cobalt, molybdenum, nickel, niobium, palladium, platinum, tantalum, titanium, tungsten, and vanadium.

4. The local interconnect of claim 2, wherein said first metal silicide comprises titanium silicide and said second metal silicide comprises tungsten silicide.

5. A local interconnect for connecting a first active semiconductor region to a second active semiconductor region on a substrate assembly, said first and second active semiconductor regions being separated by an insulating region, said local interconnect comprising:
a composite structure comprising a first refractory metal silicide, a second refractory metal silicide and an intermetallic compound reducing the resistance of said local interconnect, wherein said intermetallic compound comprises refractory metal from said first refractory metal silicide and refractory metal from said second refractory metal silicide, said refractory metal from said first refractory metal silicide being different from said refractory metal from said second refractory metal silicide, wherein said intermetallic compound contains no non-metallic materials.

6. The local interconnect of claim 5, wherein said composite structure has a thickness in the range of about 700 Angstroms to about 1800 Angstroms.

7. A semiconductor device comprising:
a substrate assembly having at least one semiconductor layer;
at least one field effect transistor formed in said at least one semiconductor layer, said least one field effect transistor having a source, a drain and a gate; and
a local interconnect for connecting at least one of said source, said drain and said gate to another active area within said substrate assembly, said local interconnect comprising a composite structure comprising a first refractory metal silicide, a second refractory metal silicide and an intermetallic compound reducing the resistance of said local interconnect, wherein said intermetallic compound comprises refractory metal from said first refractory metal silicide and refractory metal from said second refractory metal silicide, wherein said intermetallic compound contains no non-metallic materials.

8. A memory array comprising:
a plurality of memory cells arranged in rows and columns and formed on a substrate assembly having at least one semiconductor layer, each of said plurality of memory cells comprising at least one field effect transistor, and
at least one local interconnect for connecting at least one of a source, a drain and a gate of said at least one field effect transistor in one of said plurality of memory cells to one of an active area within said one memory cell or to one of a source, a drain and a gate of said at least one field effect transistor in another one of said plurality of memory cells, said local interconnect comprising a composite structure comprising a first refractory metal silicide, a second refractory metal silicide and an intermetallic compound reducing the resistance of said local interconnect, wherein said intermetallic compound comprises refractory metal from said first refractory metal silicide and refractory metal from said second refractory metal silicide, wherein said intermetallic compound contains no non-metallic materials.

9. The memory array of claim 8, further comprising a plurality of local interconnects for connecting additional active areas within each of said plurality of memory cells.

10. The memory array of claim 8, further comprising a plurality of local interconnects for connecting together active areas from different memory cells.

11. A local interconnect comprising:
a composite structure comprising a first metal silicide, a second metal silicide and an intermetallic compound formed by a reaction between said first metal silicide and said second metal silicide, wherein said intermetallic compound comprises metal from said first metal silicide and metal from said second metal silicide reducing the resistance of said local interconnect, wherein said intermetallic compound contains no non-metallic materials.

12. The local interconnect of claim 5, wherein said first metal silicide comprises titanium silicide and said second metal silicide comprises tungsten silicide.

13. The local interconnect of claim 11, wherein said intermetallic compound comprises titanium tungsten.

14. The semiconductor device of claim 7, wherein said first metal silicide comprises titanium silicide and said second metal silicide comprises tungsten silicide.

15. The semiconductor device of claim 14, wherein said intermetallic compound comprises titanium tungsten.

16. The memory array of claim 8, wherein said first metal silicide comprises titanium silicide and said second metal silicide comprises tungsten silicide.

17. The memory array of claim 16, wherein said intermetallic compound comprises titanium tungsten.

18. The local interconnect of claim 11, wherein said first metal silicide comprises titanium silicide and said second metal silicide comprises tungsten silicide.

19. The local interconnect of claim 18, wherein said intermetallic compound comprises titanium tungsten.

* * * * *

UNITED STATES PATENT AND TRADEMARK OFFICE
CERTIFICATE OF CORRECTION

PATENT NO. : 7,701,059 B1  Page 1 of 1
APPLICATION NO. : 08/915658
DATED : April 20, 2010
INVENTOR(S) : Jigish D. Trivedi It is certified that error appears in the above-identified patent and that said Letters Patent is hereby corrected as shown below:

In column 10, line 4, in Claim 2, delete "silicide," and insert -- silicide --, therefor.

In column 10, line 38, in Claim 7, delete "said least one" and insert -- said at least one --, therefor.

In column 10, line 55, in Claim 8, delete "transistor, and" and insert -- transistor; and --, therefor.

Signed and Sealed this

Eighth Day of June, 2010

David J. Kappos
*Director of the United States Patent and Trademark Office*